United States Patent
Kaczkowski

(10) Patent No.: US 6,288,625 B1
(45) Date of Patent: *Sep. 11, 2001

(54) CURRENT TRANSFORMER FOR A METAL-ENCLOSED GAS-INSULATED HIGH-VOLTAGE INSTALLATION

(75) Inventor: Andrzej Kaczkowski, Würenlingen (CH)

(73) Assignee: Asea Brown Boveri AG, Baden (CH)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/496,186

(22) Filed: Jun. 28, 1995

(30) Foreign Application Priority Data

Aug. 24, 1994 (DE) .................................. 44 29 959

(51) Int. Cl.$^7$ ........................................ H01F 27/36
(52) U.S. Cl. .................. 336/84 C; 336/84 R; 336/174
(58) Field of Search .......................... 336/84 C, 84 R, 336/174, 175; 324/126, 127; 174/73.1

(56) References Cited

FOREIGN PATENT DOCUMENTS

| 1807996 | 5/1970 | (DE) . |
|---|---|---|
| 2035553 | 4/1979 | (DE) . |
| 3544508A1 | 6/1987 | (DE) . |
| 4322944A1 | 5/1994 | (DE) . |
| 0522303A2 | 1/1993 | (EP) . |

*Primary Examiner*—Anh Mai
(74) *Attorney, Agent, or Firm*—Burns, Doane, Swecker & Mathis, L.L.P.

(57) ABSTRACT

This current transformer is provided, in particular, for a metal-enclosed gas-insulated high-voltage installation. It has a toroidally formed current sensor enclosing a current path and a signal processing system downstream of said sensor. The current sensor is surrounded by an electrically conducting screen which encloses an annular cavity filled with a compound (4). The screen is interrupted by a circumferential gap (9) designed as an interruption in the screen.

It is intended to provide, for metal-enclosed gas-insulated high-voltage installations, a current transformer which is insensitive even to extremely high-frequency electrical interferences, which is inexpensive to construct and which is notable for small dimensions and for a high measurement accuracy. This is achieved by designing said interruption in the screen so that it is effective during the normal operation of the current transformer (1) and is shunted if high-frequency interferences occur.

14 Claims, 4 Drawing Sheets

CURRENT TRANSFORMER FOR A METAL-ENCLOSED GAS-INSULATED HIGH-VOLTAGE INSTALLATION

BACKGROUND OF THE INVENTION

1. Field of the Invention

The invention proceeds from a current transformer for a metal-enclosed gas-insulated high-voltage installation accordance with the preamble of claim 1 or of claim 9.

2. Discussion of Background

In this connection, the invention relates to a prior art as disclosed, for example, in the publication EP-A2-0 522 303. The combined instrument transformer described therein is intended for a metal-enclosed gas-insulated high-voltage installation. It has a current sensor and a voltage sensor and a signal processing system downstream of the current sensor and voltage sensor. The current sensor used is a pickup coil which is wound around an annular core composed of nonferromagnetic, predominantly isotropic material. Provided as voltage sensor is a hollow-cylindrically formed measuring electrode. After the current sensor and the voltage sensor have been installed in the metal enclosure, the coil and the measuring electrode concentrically surround a current conductor of the gas-insulated switching installation.

The pickup coil is embedded in an annular insulating body which is disposed in an annular space. The walls of the space are composed of electrically conducting material, preferably of an aluminum alloy. The insulating body is fixed in position in said space. On its circumferential surface adjacent to the current conductor, the space is bounded by an areal, annular screening electrode. One end face of this screening electrode is connected in an electrically conducting manner to the wall on one side of the annular space, while the end face situated opposite it is connected in an electrically insulating manner to the wall on the other side of the annular space. Provided here as insulating connection is a comparatively narrow gap completely filled with insulating material. The walls of the annular space form an electrically conducting screen with the screening electrode. Said screen protects the annular space against the influence of electrical interference fields. During measurement in the high-voltage installation under operating conditions, the pickup coil therefore delivers signals which are free of influences due to the electrical interference fields. The pickup coil provides signals which are proportional to the magnitude and the change with respect to time of the current flowing in the current conductor of the gas-insulated switching installation and which are virtually free of the effects of electrical extraneous fields because of the suitably disposed screen. For many practical applications, a current transformer constructed in this manner is probably completely satisfactory.

However, the gap filled with insulating material in the screen surrounding the pickup coil is the reason for rapid and very rapid transient electrical interferences, for example in a frequency range from more than 1 MHz to approximately several GHz, not being isolated from the pickup coil. Such interferences distort the measured signal and they may additionally be the reason for the overvoltage protection always present at the input of the signal processing system being overloaded.

SUMMARY OF THE INVENTION

Accordingly, one object of the invention, as it is specified in the independent patent claims, is to provide a novel current transformer for metal-enclosed gas-insulated high-voltage installations which is also insensitive to extremely high-frequency electrical interferences, which is inexpensive to construct and which is notable for small dimensions and for a high measurement accuracy.

The current transformer according to the invention is notable for the fact that it is protected against high-frequency interferences. The current transformer has a toroidally formed current sensor enclosing a current path and a signal processing system downstream of said sensor. It furthermore has an annular cavity which surrounds the current sensor and is enclosed by an electrically conducting screen and which is filled with a compound. In addition, it is provided with at least one circumferential gap designed as an interruption in the screen. Said at least one interruption in the screen is designed so that it is fully effective during the normal operation of the current transformer and that it is shunted if high-frequency interferences occur. The high-frequency interference is accordingly rendered harmless, while the measured-value determination in the current transformer continues unaffected at the same time.

In a preferred embodiment of the current transformer, the gap is of labyrinth-type design. Conducting or semiconducting means are provided for shunting it.

In one embodiment, discrete ohmic resistors are provided as conducting means. However, suitably doped plastics materials which fill the gap or, alternatively, a suitably doped seal, preferably designed as a cord-packing ring, which seals the gap are also possible as conducting or semiconducting means.

In a further embodiment, the gap is shunted by means of an electrically conducting metal foil. However, the gap may also be shunted by means of an electrically conducting or semiconducting plastics foil.

In a further embodiment of the current transformer, in particular for metal-enclosed gas-insulated high-voltage installations which are subject to less intensive high-frequency interferences, the screen is formed as at least one electrically conducting or semiconducting foil having at least one layer. Said current transformer can be produced particularly favorably in terms of cost and, in addition, it is particularly easy to install in the installations.

The further developments of the invention are the subjects of the dependent claims.

BRIEF DESCRIPTION OF THE DRAWINGS

A more complete appreciation of the invention, its further development and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
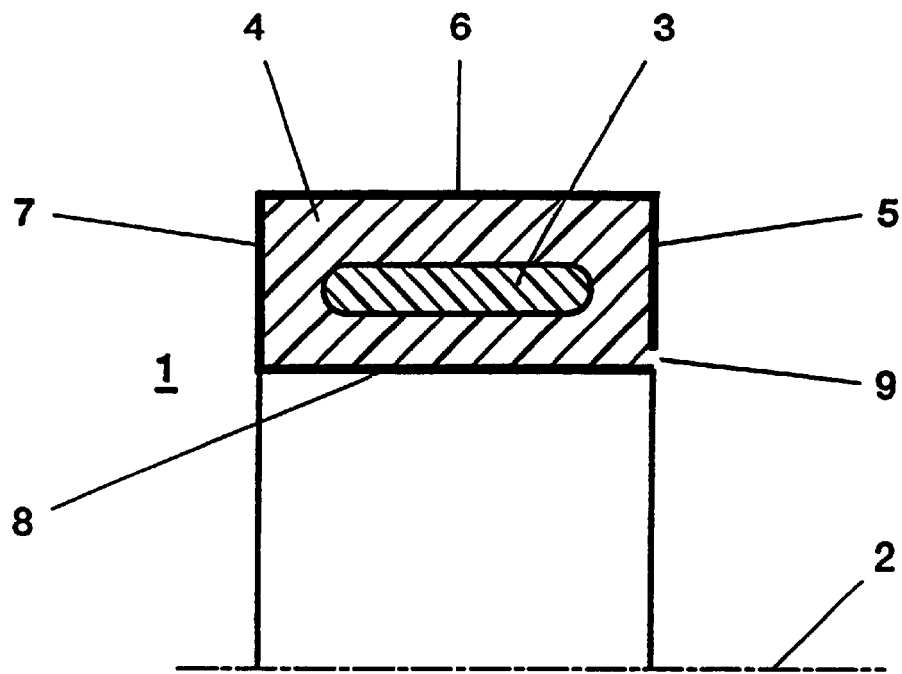
FIG. 1 shows a section through a diagrammatically shown current transformer which is regarded as prior art.

Referring now to the drawings, wherein like reference numerals designate identical or corresponding parts throughout the several views and all those elements which are unnecessary for an immediate comprehension of the invention are not shown, FIG. 1 shows a section through a diagrammatically dsyhown, annularly formed current transformer 1 which is regarded as prior art. Said current transformer 1 concentrically surrounds a current conductor of the metal-enclosed gas-insulated switching installation. Of said current conductor, only the central axis 2, which is simultaneously the central axis of the metal enclosure in the case of a gas-insulated switching installation metal-enclosed as a single phase, is shown. Used here as current sensor is a pickup coil 3 which is wound round an annular core, not denoted, composed of a nonferromagnetic, predominantly isotropic material. However, other toroidally formed current sensors may also be used in place of the latter. The signal lines leading away from the pickup coil 3 into a signal processing system which is not shown are likewise not shown. The pickup coil 3 is disposed in an annularly formed cavity which has a rectangular cross section and is filled with an electrically insulating compound 4. The cavity is bounded by electrically conducting walls 5, 6, 7, 8 which act as a screen and which are indicated by lines which have a somewhat greater line thickness. The structural design of the components forming the walls 5, 6, 7, 8 will not be described in greater detail here. Said components, may, for example, be designed similarly to those shown in the publication EP-A2-0 522 303. If more than one current conductor is provided in the metal-enclosed gas-insulated switching installation, the current transformers and the voltage sensors optionally connected to the latter do in fact concentrically surround the respectively assigned current conductor, but they do not then have the same central axis as the metal enclosure.

In this embodiment of the current transformer 1, there remains between the wall 8 and the wall 5 a comparatively narrow gap 9 which runs round the entire circumference of said current transformer 1. Said gap 9 is likewise filled with the insulating compound 4. The gap 9 prevents induced stray currents from being able to flow through the screen, as a result of which stray currents the magnetic field passing through the pickup coil 3 would be distorted, which would result in an impairment of the measurement accuracy of the current transformer. If the screen is connected in an electrically conducting manner to the metal enclosure of the gas-insulated switching installation, the gap 9 additionally prevents components of the enclosure current flowing through the metal enclosure of the gas-insulated switching installation from being able to flow through the wall 8, which would likewise result in an impairment of the measurement accuracy of the current transformer. The metal walls of the gap 9, which are of labyrinth-like design, are additionally intended to prevent a penetration of electrical interference fields into the immediate vicinity of the pickup coil 3. Rapid and very rapid transient electromagnetic interferences, for example in a frequency range from more than 1 MHz to approximately several GHz, are, however, not thereby isolated from the pickup coil.

Figure 2:
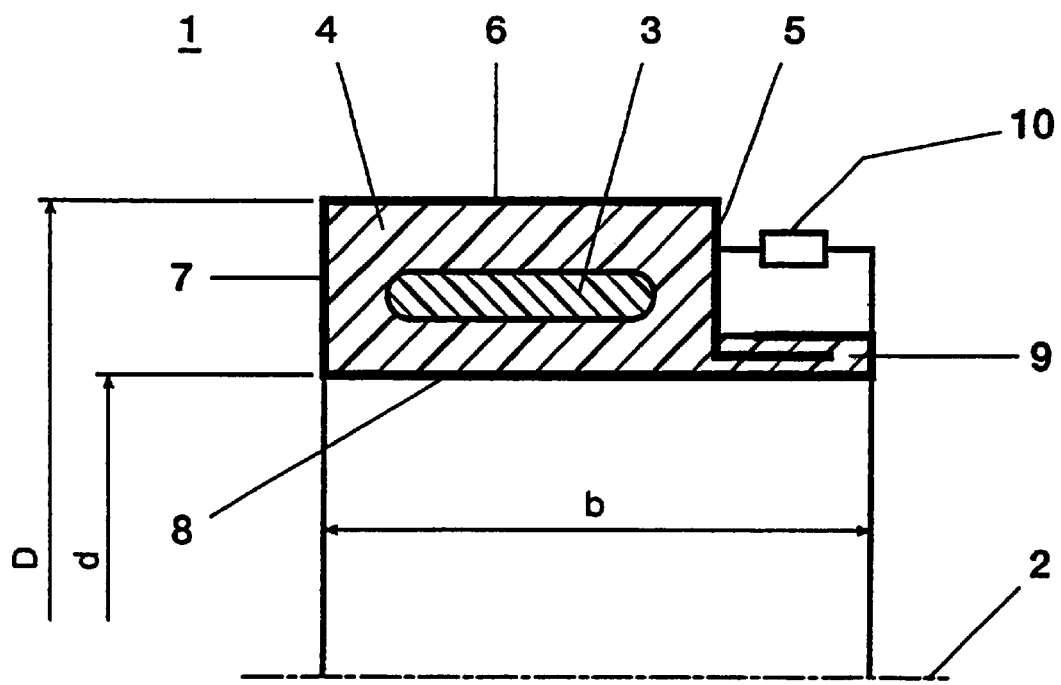
FIG. 2 shows a section through a diagrammatically shown first embodiment of a current transformer according to the invention.

FIG. 2 shows a section through a diagrammatically shown first embodiment of a current transformer 1 according to the invention. The latter differs from the current transformer 1 according to FIG. 1 only in that the gap 9 is of labyrinth-like design and is shunted in an electrically conducting manner by a parallel circuit of a number of discrete ohmic resistors 10. The ohmic resistors 10 are uniformly distributed over the circumference of the current transformer 1 and they form a kind of cage. The dimension b indicates the axial width of the screen extended in the direction of the central axis 2, the dimension D indicates the external diameter of the screen and the dimension d indicates the internal diameter of the screen.

Figure 3:
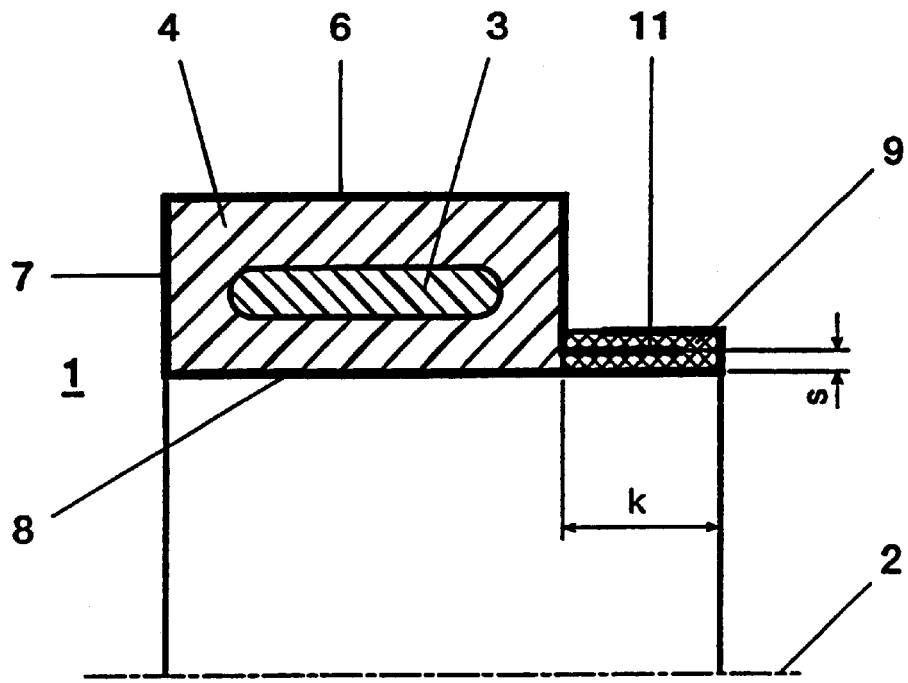
FIG. 3 shows a section through a diagrammatically shown second embodiment of a current transformer according to the invention.

FIG. 3 shows a section through a diagrammatically shown second embodiment of a current transformer according to the invention. In this embodiment, the function of the ohmic resistors 10 is assumed by a poorly conducting or semiconducting compound 11 with which the gap 9 of labyrinth-type design is completely filled in this case. The remaining structure of this current transformer 1 corresponds to that of the embodiment shown in FIG. 2. The resistivity a of the conducting or semiconducting compound 11 will in this case preferably be in the range from 100 $\mu\Omega$m to 1 m$\Omega$m.

Figure 4:
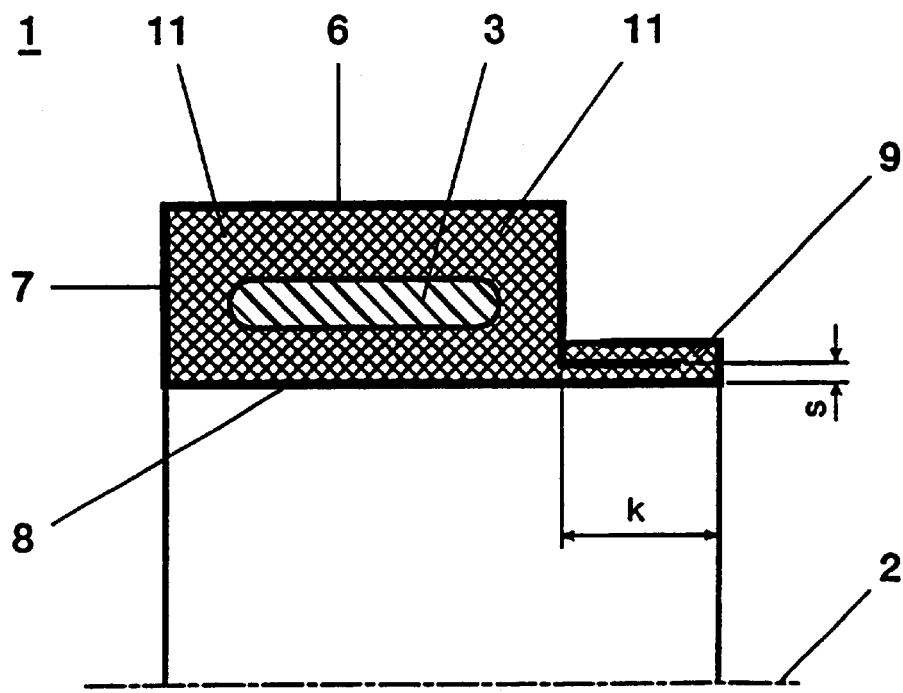
FIG. 4 shows a section through a diagrammatically shown third embodiment of a current transformer according to the invention.

FIG. 4 shows a section through a diagrammatically shown third embodiment of a current transformer 1 according to the invention. In this current transformer 1, not only is the gap 9 of labyrinth-type design filled with the semiconducting 20 compound 11, but also the entire annular cavity enclosed by the walls 5, 6, 7, 8. The resistivity σ of the conducting or semiconducting compound 11 will in this case preferably also be in the range from 100 $\mu\Omega$m to 1 m$\Omega$m.

Figure 5:
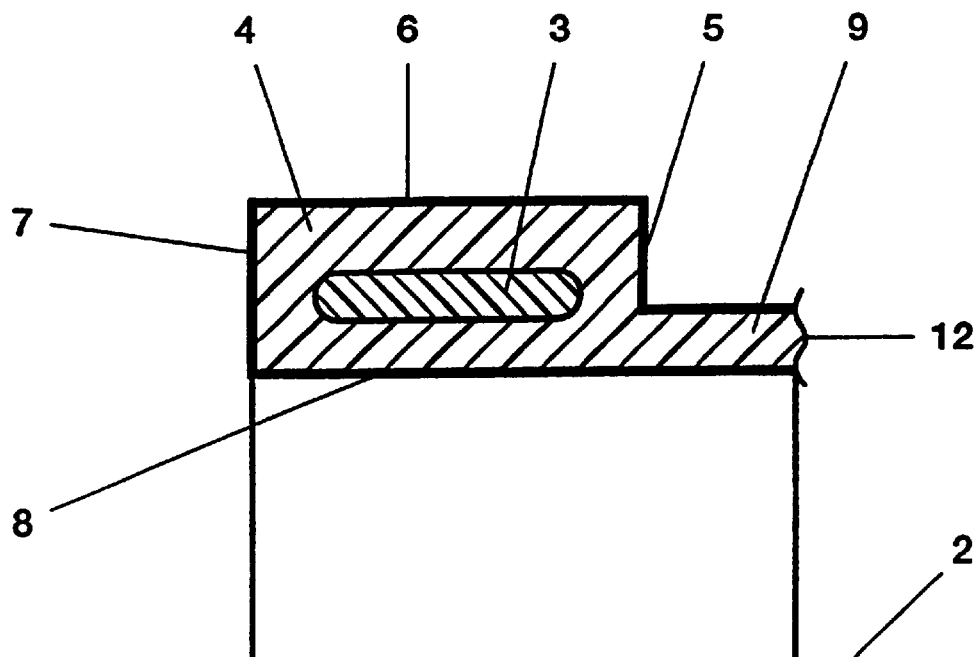
FIG. 5 shows a section through a diagrammatically shown fourth embodiment of a current transformer according to the invention.

FIG. 5 shows a section through a diagrammatically shown fourth embodiment of a current transformer 1 according to the invention. In this current transformer 1, the entire cavity enclosed by the walls 5, 6, 7, 8 and also the gap 9 are filled with the insulating compound 4. Here the gap 9 is sealed by a comparatively thin metal foil 12 which is shown as a wavy line and which interconnects the two lateral walls, which are not shown, of the gap in an electrically conducting manner. The metal foil 12 closes the gap 9 over the entire circumference of the current transformer 1. The thickness of the metal foil 12 is determined as a function of the conductivity of the material used for it; for metals with good conduction such as, for example, Ag, Cu or Al and alloys based on these metals, it is approximately 0.1 $\mu$m, for Ti or constantan it is approximately 0.2 $\mu$m and for an 80/20 chromium-nickel alloy it is approximately 4.5 $\mu$m. Said thickness depends on the penetration depth of high-frequency currents into the respective metal or into the respective metal alloy. However, instead of a metal foil, a conducting or semiconducting foil made of a suitable plastics material may also be used. Such foils may be single-layer or multilayer, and the individual layers may be of different composition in the case of the multilayer version.

As a result of this possibility, the effectiveness of the shunting of the gap 9 can be optimally matched to the high-frequency interferences to be coped with by the current transformer 1, with the result that the influencing of its measurement accuracy by said interferences can be neglected.

Figure 6:
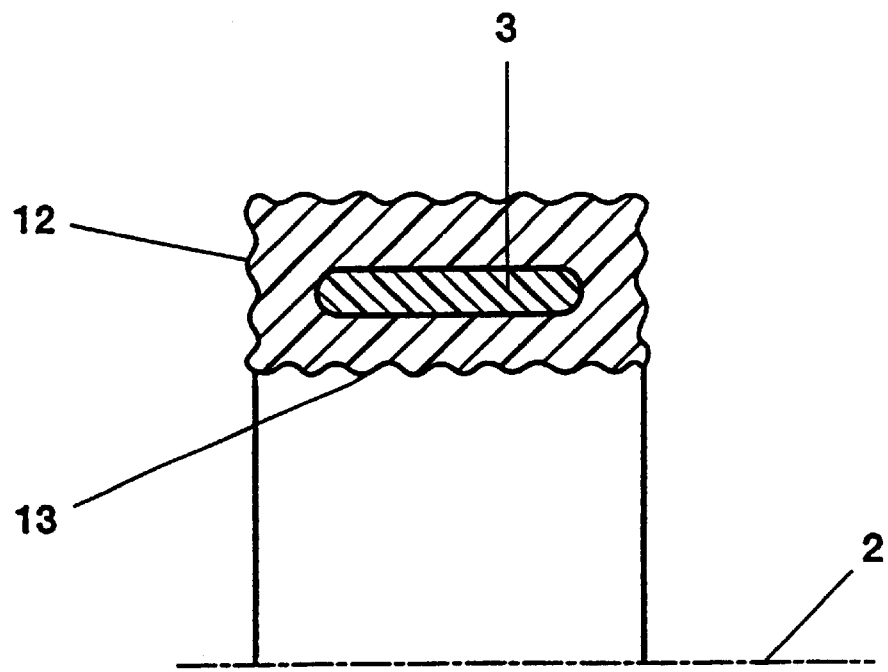
FIG. 6 shows a section through a diagrammatically shown fifth embodiment of a current transformer according to the invention.

FIG. 6 shows a section through a diagrammatically shown fifth embodiment of a current transformer 1 according to the invention. In this current transformer 1, the annular cavity surrounding the pickup coil 3 is completely filled with the insulating compound 4. The outsides of the insulating compound 4 are completely covered with an electrically conducting metal foil 12 shown as a wavy line, a gap not being provided in this case. The thickness of the metal foil 12 is determined as a function of the conductivity of the material used for it; for metals with good conduction such as, for example, Ag, Cu or Al and alloys based on said metals it is approximately 3.5 µm, for Ti or constantan it is approximately 80 µm and for an 80/20 chromium-nickel alloy it is approximately 180 µm. Said thickness depends on the penetration depth of high-frequency currents into the respective metal. When installed in the metal-enclosed gas-insulated switching installation, this current transformer does not have to be insulated from the metallic enclosure since the metal foil 12, which forms the internal surface 13 of the current transformer 1, has such a small cross section and consequently such a small current-carrying capacity that the current flowing through it cannot cause any appreciable distortion of the measured value recorded by the pickup coil 3. Said current transformer 1 can be produced in a very simple and inexpensive manner and can be installed in any metal-enclosed gas-insulated switching installation without expensive installation fittings. However, instead of a metal foil, a conducting or semiconducting foil made of a suitable plastics material may also be used.

Said foils may be of single-layer or multilayer design, and the individual layers may be of different composition in the multilayer version. As a result of this possibility, the effectiveness of the screen can be optimally matched to the operating requirements imposed on the current transformer 1, in particular, however, to the high-frequency interferences to be expected in the respective metal-enclosed gas-insulated switching installation.

Figure 7:
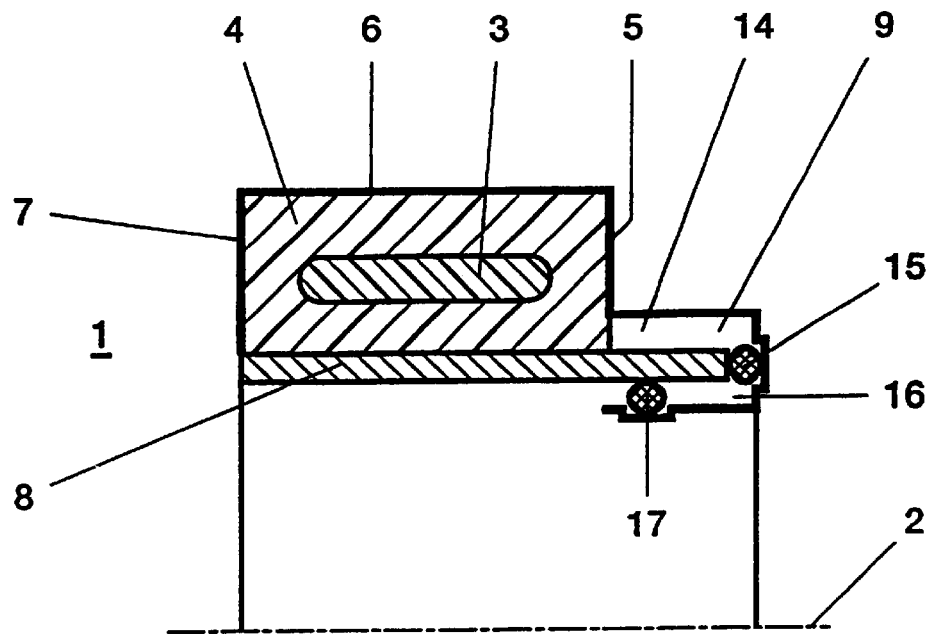
FIG. 7 shows a section through a diagrammatically shown sixth embodiment of a current transformer according to the invention.

FIG. 7 shows a section through a diagrammatically shown sixth embodiment of a current transformer 1 according to the invention. In this current transformer 1, the annular cavity surrounding the pickup coil 3 is completely filled with the insulating compound 4. Here a first portion 14 of the gap 9 of labyrinth-type design is filled with a gas, for example with air. A seal 15, designed for example as an elastic cord-packing ring and composed of electrically insulating material, separates the first portion 14 from a second portion 16 of the gap 9 in a gastight manner. The second portion 16 is sealed from the internal space, filled with insulating gas, of the metal-enclosed gas-insulated switching installation by means of a further seal 17. The second portion 16 is filled with sulfur hexafluoride ($SF_6$) or another insulating gas. The seal 17 is manufactured from an electrically conducting or semiconducting material, for example in the form of an elastic cord-packing ring. This embodiment may also be somewhat simplified by omitting the seal 15. In this case, the entire internal space of the gap 9 is filled with a gas, for example with air.

Figure 8:
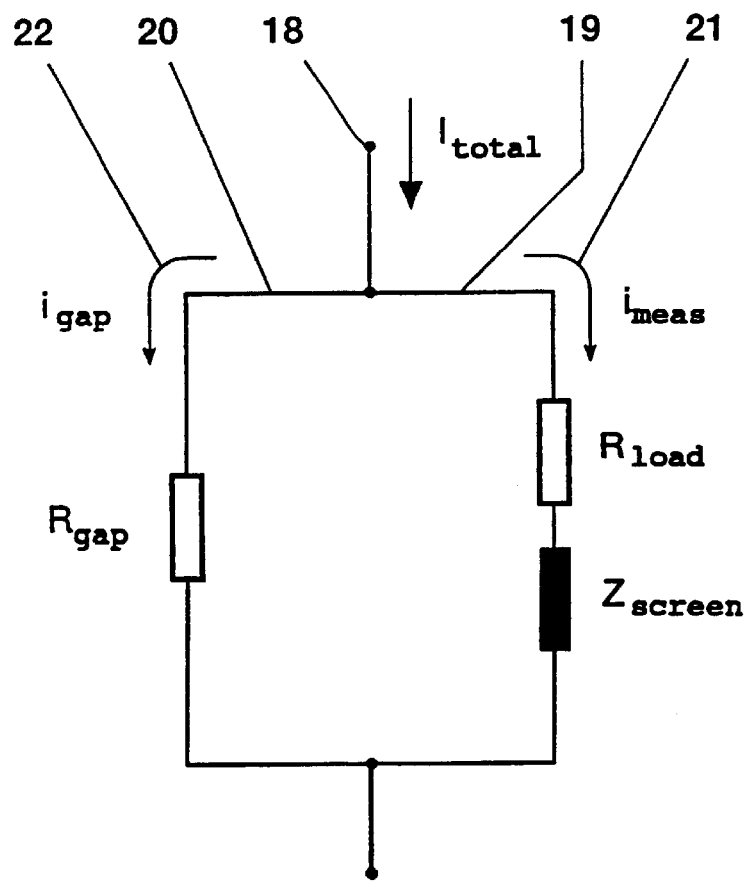
FIG. 8 shows a considerably simplified electrical equivalent circuit diagram of a current transformer according to the invention.

FIG. 8, which shows a considerably simplified electrical equivalent circuit diagram of a current transformer 1 according to the invention, is now considered in order to explain the mode of operation. The equivalent circuit diagram has an input 18, through which the current $I^{total}$ flows into the equivalent circuit, and two mutually parallel branches 19 and 20. As indicated by an arrow 21, the current $i_{meas}$ flows through the branch 19, while the current $i_{gap}$ flows through the branch 20, as indicated by an arrow 22. Said current $i_{gap}$, which was generated by the effect of the high-frequency interference, flows through the branch 20 and past the pickup coil 3, as a result of which only the current $i_{meas}$ flowing through the branch 19 is applied to said coil for the measurement. The high-frequency interference is accordingly rendered completely harmless in this current transformer 1, and the measured value continues to be determined in the branch 19 in an uninfluenced manner. The branch 19 is wired with a series connection of an ohmic resistance $R_{load}$ and an impedance $Z_{screen}$. The resistance $R_{load}$ is an equivalent resistance which occurs between the edges of the gap 9 and which is due to the transformed input resistance of the signal processing system downstream of the current transformer 1. The impedance $Z_{screen}$ is predominantly inductive and is to be regarded as the impedance of the screen which occurs across the gap 9 in the latter. Both $R_{load}$ and $Z_{screen}$ can be determined from the geometrical dimensions of the current transformer 1, as described below. The ohmic resistance $R_{gap}$ is determined, on the other hand, with the aid of two conditions which are cited below and which define its dependence on $R_{load}$ and $Z_{screen}$.

The following calculation formulae are decisive:

$$R_{load} = \frac{(2\pi \cdot F \cdot M_{pickup})^2}{R_{electr}} \tag{1A}$$

Here:

$R_{load}$ is an equivalent resistance which occurs between the edges of the gap 9 and which is due to the transformed input resistance of the signal processing system;

F is the working frequency of the current transformer;

$M_{pickup}$ is the pickup coil constant;

$R_{electr}$ is the input impedance of the signal processing system, i.e. the load imposed on the pickup coil.

The inductance Lscreen of the screen surrounding the pickup coil 3 is calculated using the following formula:

$$L_{screen} = \frac{\mu_0 \cdot b \cdot \ln\left(\frac{D}{d}\right)}{2\pi} \tag{2A}$$

Here:

$\mu_0$ is the magnetic constant ($=4\pi \cdot 10^{-7} \cdot$H/m);

b is the axial width of the screen;

D is the external diameter of the screen;

d is the internal diameter of the screen.

The predominantly inductive impedance of the screen $Z_{screen}$, which occurs across the gap 9 in the screen, is calculated using the following formula:

$$Z_{screen} = 2 \cdot \pi \cdot F \cdot L_{screen} \tag{3A}$$

The following two conditions are decisive for determining the magnitude of the parallel-connected ohmic resistance $R_{gap}$:

First condition:

$$R_{gap} \geq \frac{R_{load}}{\delta} \tag{4A}$$

Here:

δ is the specified accuracy of measurement.

Second condition:

$$R_{gap} > \frac{Z_{screen}}{\sqrt{\delta}} \qquad (5A)$$

These two conditions must be fulfilled if the resistance $R_{gap}$ is to have a technically meaningful value, that is to say if a screen is to be provided which is also very effective in the high frequencies range.

The first condition (4A) ensures that the ohmic resistance $R_{gap}$ fulfilling this condition carries virtually no current igap or only a negligible current igap during normal operation of the current transformer 1, that is to say at an operating frequency in the region around 50 Hz. The current igap is in this case in phase with the current which flows through the input resistance of the signal processing system. The resistance $R_{gap}$ is substantially greater at this frequency than the ohmic resistance $R_{load}$ of the screen connected in parallel with said resistance $R_{gap}$. If the specified accuracy of measurement δ is set, for example, at ¹⁄₁₀₀₀, it emerges from the first condition (4A) that the resistance $R_{gap}$ must be approximately a thousand times greater than the resistance $R_{load}$.

The second condition (5A) takes account of the influence of the predominantly inductive impedance $Z_{screen}$ of the screen, which occurs across the gap 9 in the screen. Said predominantly inductive impedance causes a phase shift of approximately 90°. If the specified accuracy of measurement δ is also set here at, for example, ¹⁄₁₀₀₀, it emerges from the second condition (5A) that the resistance $R_{gap}$ must be approximately thirty times greater than the resistance $R_{load}$.

Of these two conditions, the one which is always the more critical for the respective case is always decisive.

The comparatively low power $P_{load}$ delivered to the signal processing system by the pickup coil 3 is determined by the following equation:

$$P_{load} = \frac{(U_{coil})^2}{R_{electr}} \qquad (6A)$$

In addition, the amplitude rule also applies:

$$\left|\frac{di_{meas}}{dt}\right| = 2\pi F \cdot i_{meas} \qquad (7A)$$

Here:

$di_{meas}/dt$ is the differentiation with respect to time of a current $i_{meas}$ which corresponds to the current flowing through the inner conductor which passes through the current transformer;

$i_{meas}$ is the amplitude of the current which corresponds to the amplitude of the current flowing through the inner conductor which passes through the current transformer.

The following formula indicates the voltage $U_{coil}$ induced in the pickup coil 3:

$$U_{coil} = M_{pickup} \cdot \frac{di_{meas}}{dt} \qquad (8A)$$

The resistance $R_{load}$ can be calculated using the following equation:

$$R_{load} = \frac{P_{load}}{i_{meas}^2} \qquad (9A)$$

If the equations (6A), (7A) and (8A) are combined with the equation (9A), equation (1A) results therefrom for the determination of the resistance $R_{load}$. In this connection, it is assumed that the current flowing through the enclosure of the gas-insulated switching installation is equal to the current flowing through its inner conductor. The resistance $R_{load}$ is a component of the impedance which is responsible for the conversion of the energy in the input resistance of the signal processing system connected in parallel with the gap 9.

For an ohmic resistance $R_{gap}$ of 0.2 mΩ, this functions with an attenuation of 52 dB for a frequency of an incoming high-frequency interference of approximately 1 MHz and with an attenuation of 150 dB for a frequency of an incoming extremely high-frequency interference of approximately 100 MHz. This extremely effective attenuation reliably prevents any harmful influence on the measured values recorded by the pickup coil 3.

The semiconducting compound 11 filling the gap 9 in the embodiment according to FIG. 3 has a resistivity σ which is calculated using the following formula:

$$\sigma = \frac{R_{gap} \cdot p \cdot 2k}{s} \qquad (10A)$$

Here:

p is the circumference of the current transformer 1;

2k is the total length of the gap 9; s is the width of the gap 9.

With $R_{gap}$=0.2 mΩ, p=1000 mm, 2k=4 mm and s=2 mm, a comparatively low resistivity σ of 400 μΩm results. In feasible designs of suitable current transformers, the values of the resistivity σ are advantageously in the range from 100 μΩm to 1 mΩm.

Current transformers which are constructed in accordance with the principle described here can also be used, if suitably modified, in outdoor switching installations which are designed for high and very high operating voltages and in medium-voltage installations, and in particular they can also be used in switching installations which are operated at comparatively high currents. Furthermore, such current transformers can be combined at comparatively low expense with capacitive voltage transformers, resulting in a combined current and voltage transformer which is easy and inexpensive to produce. Such combined current and voltage transformers are particularly suitable for metal-enclosed gas-insulated high-voltage switching installations since they have comparatively small dimensions.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A current transformer for a metal-enclosed gas-insulated high-voltage installation, comprising:

a current sensor enclosing a current path;

a signal processing system downstream of said sensor;

an electrically conducting screen surrounding the current sensor, such that an annular cavity is formed between the current sensor and the screen, the annular cavity being filled with an electrically insulating compound, wherein the screen has an interruption such that a single gap exists in the screen; and shunting means for shunting the gap when high-frequency interferences occur.

2. The current transformer of claim 1, wherein the single gap is of labyrinth-type design including a meandering gap portion filled with the electrically insulating compound, and the shunting means is a conducting means.

3. The current transformer of claim 2, wherein the conducting means includes at least one discrete ohmic resistor, each at least one resistor connected across the single labyrinth-type gap.

4. The current transformer of claim 3, wherein there are a plurality of discrete ohmic resistors distributed substantially uniformly with respect to a circumference of the current transformer.

5. The current transformer as claimed in claim 2, wherein suitably doped plastics materials which fill the gap (9) are provided as conducting or semiconducting means.

6. The current transformer as claimed in claim 2, wherein a suitably doped seal (17) which is preferably designed as a cord-packing ring and seals the gap (9) is provided as conducting or semiconducting means.

7. The current transformer as claimed in claim 1, wherein the gap (9) is shunted by means of an electrically conducting or semiconducting plastics foil (12).

8. The current transformer as claimed in claim 1, wherein at least one pickup coil (3) is provided as current sensor.

9. The current transformer as claimed in claim 1, wherein the gap (9) is shunted by means of an electrically conducting metal foil (12).

10. A current transformer for a metal-enclosed gas-insulated high-voltage installation, comprising:

a current sensor enclosing a current path;

a signal processing system downstream of said sensor;

an electrically conducting screen surrounding the current sensor, such that an annular cavity is formed between the current sensor and the screen, the annular cavity being filled with an electrically insulating compound, wherein the screen has an interruption such that a circumferential gap exists in the screen; and shunting means for shunting the gap when high-frequency interferences occur.

11. The transformer of claim 10, wherein
the gap is of labyrinth-type design including a meandering gap portion filled with the electrically insulating compound, and the shunting means is a conducting means.

12. The transformer of claim 11, wherein
the conducting means includes at least one discrete ohmic resistor, each at least one resistor connected across the gap.

13. The current transformer of claim 12, wherein there are a plurality of discrete ohmic resistors distributed substantially uniformly with respect to a circumference of the current transformer.

14. The transformer of claim 12, wherein the conducting means includes a plurality of discrete ohmic resistors, each of the plurality of discrete ohmic resistors is connected across the gap, and the discrete ohmic resistors are distributed substantially uniformly along the circumferential gap in the screen.

* * * * *